Sept. 19, 1967 A. G. F. DINGWALL ETAL 3,342,646

THERMOELECTRIC GENERATOR INCLUDING SILICON
GERMANIUM ALLOY THERMOELEMENTS
Filed Feb. 19, 1963

INVENTORS
ANDREW G. F. DINGWALL
& CAREL W. HORSTING
BY
Morris Rabkin
Attorney 3,342,646
Patented Sept. 19, 1967

3,342,646

THERMOELECTRIC GENERATOR INCLUDING SILICON GERMANIUM ALLOY THERMOELEMENTS

Andrew G. F. Dingwall, Bloomfield, and Carel W. Horsting, Caldwell, N.J., assignors to Radio Corporation of America, a corporation of Delaware Filed Feb. 19, 1963, Ser. No. 259,630
6 Claims. (Cl. 136—205)

This invention relates generally to the art of thermoelectric device construction, and more particularly to an improved thermoelectric device of the type adapted to generate electrical power by the application of heat to a strap connecting one end of each of two thermoelements of semiconductor materials of opposite conductivity types, ends remote from the aforementioned ends of the two thermoelements being maintained at a colder temperature. Such a therermoelectric device is said to operate in accordance with the Seebeck effect.

The power generated by a thermoelectric generator is a function of the difference in temperature between the hot and cold ends of its thermoelements. The efficiency of the generator is generally increased as the temperaature of the hot end is increased. While thermoelectric devices employing semiconductor materials have been found to be among the most efficient thermoelectric devices yet discovered, their efficiency and, consequently, their utility is limited by the maximum temperatures as which they can be operated. Thermoelectric devices employing silicon-germanium alloy thermoelements, for example, containing at least 50 atomic percent of silicon and having tungsten shoes bonded to the thermoelements at their hot ends, can be operated efficiently at temperatures up to about 800° C. This is considerably higher than the maximum temperatures at which other known semiconductor thermoelectric devices can be operated. But, at temperatures in excess of 800° C., a chemical reaction appears to occur between the silicon-germanium thermoelements and the metal shoes, leading to a failure of the thermoelectric device in a relatively short period of time. The difference in the coefficients of thermal expansion between the semiconductor thermoelements and the metal shoes of these thermoelectric devices at these relatively high temperatures also produces a stress on the semiconductor thermoelements that frequently causes the thermoelectric devices to fail.

The same problem of mismatch in coefficients of thermal expansion between thermoelements and connecting straps, or shoes, occurs in other heretofore used combinations of semiconductor materials and metals used in making thermoelectric power generators. Also, the problem of chemical stability in the joints between the semiconductors and metals has been widespread and difficult to solve. The presence of these problems, among others, has made it difficult to build efficient thermoelectric generators that do not deteriorate substantially when used over a lengthy period of time. And, as a result of these problems, such expedients as spring pressure contacts at the hot end of the device have been resorted to.

It is an object of the present invention to provide an improved thermoelectric device employing semiconductor thermoelements adapted to operate satsfactorily at relatively high temperatures over long periods of time.

Another object of the present invention is to provide an improved thermoelectric generator in which the joints between the thermoelements and a connecting strap do not appreciably deteriorate chemically when operated in air or in a vacuum at relatively high temperatures.

A further object of the present invention is to provide an improved thermoelectric generator in which mechanical strains at the hot end, under high temperature operating conditions, have been largely eliminated.

Another object of the present invention is to provide an improved thermoelectric device of the type described that is relatively simple in structure, reliable in operation, and efficient in use.

Briefly, the improved thermoelectric device of the present invention comprises N-type and P-type semiconductor thermoelements, and a strap connecting the ends of the two thermoelements which are to be operated at a relatively high temperature. The strap is made of a semiconductor material having substantially the same chemical stability, coefficient of thermal expansion, and electrical resistivity as the semiconductor of the thermoelements.

The novel features of the present invention, both as to its organization and method of operation, as well as additional objects and advantages thereof, will be more readily understood from the following description, when read in connection with the accompanying drawing, in which similar reference characters designate similar parts, and in which.

Figure 1:
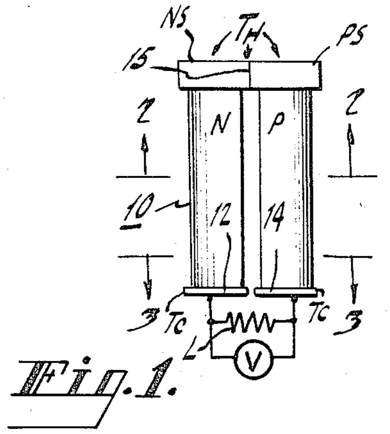
FIG. 1 is a front elevational view of a thermoelectric device in accordance with the present invention.
Figure 2:
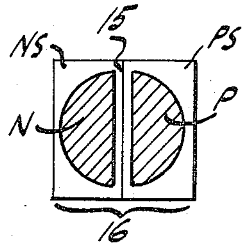
FIG. 2 is a cross-sectional view of the thermoelectric device taken along the line 2—2 in FIG. 1, and viewed in a direction indicated by the arrows.
Figure 3:
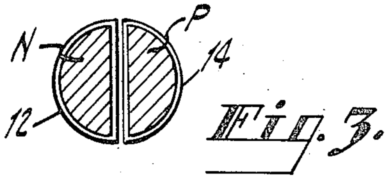
FIG. 3 is a cross-sectional view of the thermoelectric device taken along the line 3—3 in FIG. 1, and viewed in the direction indicated by the arrows.
Figure 4:
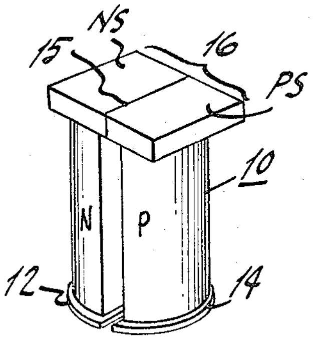
FIG. 4 is a perspective view of the thermoelectric device shown in FIG. 1.

Referring, now, to the drawing, there is shown a thermoelectric generator 10 comprising N-type and P-type semiconductor thermoelements N and P, respectively. The elements N and P may, for example, be silicon-germanium alloys having at least 50 atomic percent of silicon. These elements may be either polycrystalline or single crystalline. The thermoelement P is heavily doped with an electron acceptor element from Group III*b* of the chemical periodic table; and the thermoelement N is heavily doped with an electron doner element from Group V*b* of the chemical periodic table.

A shoe NS of N-type semiconductor material similar to that of the thermoelement N is brazed to what is to become the hot end of the thermoelement N, preferably with a noble metal, such as gold, silver, ruthenium, rhodium, palladium, iridium, or platinum, or an alloy of one or more of these chemical elements wherein the weight of the noble metal is at least 50% of the total weight. A shoe PS of P-type semiconductor material similar to that of the thermoelement P is brazed to the hot end of the element P with a noble metal or alloy of noble metals. The shoes NS and PS may be rectangular blocks of substantially the same size and having abutting faces each with an area at least as great as the cross-sectional area of each thermoelement taken perpendicularly to the longitudinal axis thereof. They are brazed to each other with a noble metal or alloy of noble metals. The exposed surface of the shoes NS and PS should be of sufficient size to receive an adequate quantity of heat for the efficient operation of the thermoelectric generator 10.

The bonding of the shoes NS and PS to each other and to the thermoelements N and P, respectively, with a noble metal or alloy of noble metals may be carried out at a temperature of about 1,075° C., under a pressure of about 50 grams/cm.$^2$ for about two minutes in a vacuum. Under these conditions, the joint between the shoes NS and PS is a bond 15 of relatively low electrical resistance, rather than a typical high resistance, PN rectifying junction.

A pair of metal shoes 12 and 14, preferably of tungsten, is fixed to what is to become the cold ends of the thermoelements N and P, by any suitable known bonding technique, such as brazing the tungsten shoes to the cold ends of these thermoelements with copper. Because the temperature at the cold end of the thermoelectric device is usually relatively low during the operation of the device, no special precautions are necessary to make chemically stable, coefficient of expansion-matched bonds at the cold joints. If desired, however, the metal shoes 12 and 14 may be bonded to the thermoelements N and P with a noble metal or an alloy of noble metals at the same time the shoes NS and PS are bonded to each other and to the thermoelements N and P.

The shoes NS and PS may be formed integrally with the thermoelements N and P, respectively, instead of brazing the shoes to these thermoelements, as explained above. When so formed, only the abutting surfaces of the shoes NS and PS are brazed to each other. When the shoes NS and PS are brazed to each other, they comprise a hot strap 16. The cross-sectional area of the hot strap 16, parallel to the faces of the shoes NS and PS that abut each other at the brazed bond 15, should comprise substantially the same area as the cross-sectional area of either the N or P elements, perpendicular to their longitudinal axes, or the direction of current flow therethrough, so that current may flow from one thermoelement to the other through the hot strap 16 without encountering a substantial increase in electrical resistance. By using a noble metal or an alloy of noble metals as the brazing means, it has been found that the bond formed is one of relatively low electrical resistance, instead of the higher resistance of a typical PN rectifying junction.

In the operation of the thermoelectric generator 10, heat is applied to the hot strap 16 by any suitable means. The temperature $T_H$ of the applied heat can be almost as high as the melting point of the noble metal used to braze the shoes NS and PS that comprise the hot strap 16. The tungsten shoes 12 and 14 are placed in contact with a heat sink (not shown) to maintain them at a relatively lower temperature $T_C$, as compared to the higher temperature $T_H$. Under these conditions, a voltage, measurable with a voltmeter V, is generated between the shoes 12 and 14, and current is caused to flow through a load L, represented herein as a resistor, connected between the shoes 12 and 14.

In the embodiments of the invention which have been described above, the hot strap 16 connecting the hot ends of the thermoelements N and P has been of the same semiconductor material as the thermoelements themselves. However, it is not necessary that the hot strap be of the same material as the thermoelements. The hot strap can not differ too much from the thermoelements in composition because the hot strap should have substantially the same coefficient of linear expansion as the thermoelements. It should be of a material which does not react with the thermoelement material at operating temperatures. It should have low electrical resistivity and, finally, should be of a material which is itself chemically stable at high temperatures in the presence of air. That is, it should not have a volatile ingredient which is driven off at relatively high temperatures, and it should not oxidize to such an extent that deterioration occurs.

Figure 5:
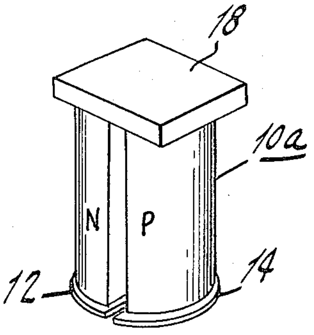
FIG. 5 is a perspective view of another embodiment of the present invention.

If the thermoelements are made of germanium-silicon alloys, materials preferred for high temperature operation, then the strap connecting the two thermoelements at the hot end of the device can be either N-type or P-type silicon, heavily doped. Referring, now, to FIG. 5, a thermoelectric device **10*a* may comprise an N-type thermoelement N, a P-type thermoelement P, and a connecting hot strap 18 composed of, say, N-type silicon. If the hot strap 18 is N-type silicon, the thermal junction will be at the interface between the P-type element P and the hot strap 18. If the hot strap 18 is, on the other hand, P-type silicon, the thermal junction will be at the interface between the N-type thermoelement N and the strap 18. The thermoelements N and P may have tungsten shoes 12 and 14**, respectively, bonded at the opposite or cold end of the elements.

Silicon is a suitable element to use for the hot strap 18 in this device because its coefficient of expansion is very little different from the high silicon content alloys of germanium and silicon which are most desirable for this type of device if it is to operate at the highest possible temperatures. Silicon, furthermore, is extremely stable at high temperatures, does not react with the silicon-germanium alloys used in the thermoelements, and it has sufficiently low electrical resistivity when heavily doped to meet this requirement. The hot strap 18 may be bonded to the thermoelements N and P, as in the previous examples, using noble metal alloys as described.

The cross-sectional area of the strap 18 in a plane perpendicular to the length or width axis of the strap should be at least equal to the area of the end of either of the thermoelements N or P.

Another desirable feature of the connecting hot strap 18 utilized in the present invention is that it have a major face area at least equal to the sum of the areas of the ends of the thermoelements to which it is connected. This is to assure sufficient heat collecting area for efficient device operation. If this area is decreased in size, much heat may be wasted and power output will be lowered in relation to heat input.

What is claimed is:

1. A thermoelectric generator comprising:
N-type and P-type silicon-germanium alloy thermoelements,
a hot strap of a material other than said alloy comprising a P-type silicon semiconductor shoe and an N-type silicon semiconductor shoe, the material of said shoes being heavily doped to have low electrical resistivity, said shoes being bonded to each other to form a non-rectifying, low resistance junction, said P-type thermoelement being bonded to said P-type shoe, and said N-type thermoelement being bonded to said N-type shoe.

2. A thermoelectric generator comprising:
N-type and P-type silicon-germanium alloy thermoelements each having two ends,
a hot strap of a material other than said alloy comprising a P-type silicon semiconductor shoe and an N-type silicon semiconductor shoe, the material of said shoes being heavily doped to have a low electrical resistivity, said shoes being bonded to each other to form a non-rectifying, low resistance junction,
one of said ends of said P-type thermoelement being bonded to said P-type shoe and one of said ends of said N-type thermoelement being bonded to said N-type shoe, and
a separate metal shoe being brazed to each of the other of said ends of said thermoelements.

3. A thermoelectric device comprising:
N-type and P-type silicon-germanium thermoelements,
a P-type silicon semiconductor hot strap heavily doped to have a low electrical resistivity bonded to said P-type thermoelement, and
said hot strap being bonded to said N-type thermoelement.

4. A thermoelectric device comprising:
N-type and P-type silicon-germanium alloy thermoelements,
a hot strap comprising an N-type silicon semiconductor material heavily doped to have a low electrical resistivity,
said P-type thermoelement being bonded to said hot strap, and
said N-type thermoelement being bonded to said hot strap, the bonds between said hot strap and said thermoelements being relatively low resistance, non-rectifying junctions.

5. A thermoelectric generator comprising:

N-type and P-type silicon germanium alloy thermoelements each having a hot end and a cold end, a shoe of a material other than said alloy bonded to the hot end of said P-type thermoelement, said material comprising a P-type silicon semiconductor material, a shoe of a material other than said alloy bonded to the hot end of said N-type thermoelement, said material comprising an N-type silicon semiconductor material, said shoes being bonded to each other and forming a hot strap, and a metal shoe bonded to said cold end of each of said thermoelements.

6. A thermoelectric generator comprising:

N-type and P-type silicon-germanium alloy thermoelements each having a hot end and a cold end, a shoe of a material other than said alloy bonded to the hot end of said P-type thermoelement, said material comprising a P-type silicon semiconductor material, a shoe of a material other than said alloy bonded to the hot end of said N-type thermoelement, said material comprising an N-type silicon semiconductor material, said shoes being bonded to each other and forming a hot strap, and a separate tungsten shoe brazed to said cold end of each of said thermoelements, the electrical resistivity of said hot strap being at least as low as the electrical resistivity of each of said thermoelements.

References Cited

UNITED STATES PATENTS

| | | | |
|---|---|---|---|
| 781,289 | 1/1905 | Marsh | 136—236 X |
| 2,402,663 | 6/1946 | Ohl | 136—201 X |
| 2,993,340 | 7/1961 | Sheckler | 136—204 X |
| 3,072,733 | 1/1963 | Yozo Sasaki et al. | 136—201 X |
| 3,105,906 | 10/1963 | Schultz et al. | 252—62.3 X |

FOREIGN PATENTS

| | | |
|---|---|---|
| 1,265,481 | 5/1961 | France. |
| 17,490 | 1907 | Great Britain. |

ALLEN B. CURTIS, *Primary Examiner.*

WINSTON A. DOUGLAS, *Examiner.*